United States Patent [19]

Sandhu

[11] Patent Number: 5,138,411
[45] Date of Patent: Aug. 11, 1992

[54] ANODIZED POLYSILICON LAYER LOWER CAPACITOR PLATE OF A DRAM TO INCREASE CAPACITANCE

[75] Inventor: Gurtej S. Sandhu, Boise, Id.
[73] Assignee: Micron Technology, Inc., Boise, Id.
[21] Appl. No.: 696,446
[22] Filed: May 6, 1991
[51] Int. Cl.⁵ ............................................ H01L 27/108
[52] U.S. Cl. ....................................... 357/23.6; 357/59
[58] Field of Search ............................ 357/23.6, 59, 51

[56] References Cited

U.S. PATENT DOCUMENTS

| | | | |
|---|---|---|---|
| 4,057,823 | 11/1977 | Burkhardt et al. | 357/52 |
| 4,801,380 | 1/1989 | Parker et al. | 264/45.6 |
| 5,043,780 | 8/1991 | Fazan et al. | 357/23.6 |
| 5,068,199 | 11/1991 | Sandhu | 357/23.6 |

OTHER PUBLICATIONS

M. I. J. Beale, N. G. Chew, M. J. Uren, A. G. Cullis, and J. D. Benjamin; "Microstructure and Formation Mechanism of Porous Silicon"; Jan. 1, 1985, *Appl. Phys. Lett.*, pp. 86–88.

Primary Examiner—William D. Larkins
Attorney, Agent, or Firm—Susan B. Collier

[57] ABSTRACT

A DRAM cell having enhanced-capacitance attributable to the use of a textured structured polycrystalline silicon layer storage node capacitor plate. The present invention is particularly applicable to DRAM cells which employ a stacked capacitor design. Such designs generally employ a conductively-doped polycrystalline silicon layer as the storage node, or lower, capacitor plate. A microstructure is formed by anodizing the storage node plate layer in a solution of hydrofluoric acid to produce microstructures resembling elongated depressions in the storage node plate layer. This is followed by the deposition of a thin conformal (typically less than 100 Angstroms) silicon nitride layer which in turn is followed by the deposition of a second polycrystalline silicon (poly) layer, which functions as the capacitor field plate. Since the nitride layer is thin in comparison to the elongated depressions in the storage node plate layer, capacitive area is substantially augmented. Cell capacitance can be increased by more than 1,000 percent using a storage node plate having microstructures thus formed.

41 Claims, 10 Drawing Sheets

ANODIZED POLYSILICON LAYER LOWER CAPACITOR PLATE OF A DRAM TO INCREASE CAPACITANCE

FIELD OF THE INVENTION

This invention relates to semiconductor technology and, more specifically, to the design of capacitors used in dynamic random access memory (DRAM) cells. The focus of the invention is the formation of microstructures for increasing the capacitance of a DRAM cell having a polysilicon storage node capacitor plate, without increasing cell area and without utilizing any additional masking steps.

BACKGROUND OF THE INVENTION

The invention uses various materials which are electrically either conductive, insulative or semiconductive, although the completed semiconductor circuit device itself is usually referred to as a "semiconductor."

The memory cells of dynamic random access memories (DRAMs) are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. The gate 13 of FET 12 and the word line 14 are formed from an etched polycrystalline silicon-1 layer. Bit line 15 connects with access-node junction 16. Capacitor 11 has a lower plate formed from the n+ silicon substrate extension 17 of storage node junction 18 of FET 12. Upper capacitor plate (or field plate) 19 is formed from a layer of conductively-doped polycrystalline silicon. Substrate extension 17 is electrically insulated from upper plate 19 by a dielectric layer 20. Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems. Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, as cell capacitance is reduced, the sense-amp differential signal is reduced. This aggravates noise sensitivity and makes it more difficult to design a sense-amp having appropriate signal selectivity. Thirdly, as cell capacitance is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

The three-dimensional technique currently receiving the most attention involves the creation of "trench" capacitors in the cell substrate. FIG. 2 depicts a DRAM cell having a typical trench capacitor 21. Similar in concept to planar capacitor 11 of FIG. 1, the trench is employed to provide greater plate area, and hence, greater capacitance. The lower plate 22 may be formed from the n+ doped silicon substrate or it may be formed from a polysilicon layer which lines a trench cut in the n+ doped silicon substrate. The upper plate 23 is formed from a layer of conductively-doped polycrystalline silicon (poly). Lower plate 22 and upper plate 23 are electrically insulated with a dielectric layer 24. DRAM chips employing trench capacitors have been built by a number of European, Japanese and U.S. companies, including IBM Corporation, Texas Instruments, Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by Mitsubishi Electric Corporation, Hitachi, and Fujitsu, Ltd., is the stacking of capacitor plates between dielectric layers on the DRAM cell surface. FIG. 3 is a graphic representation of a typical DRAM cell having a stacked capacitor 31. The lower plate 32 is formed from an n-type polycrystalline silicon layer which is in contact with the silicon substrate 33 in the region of the FET storage node junction, while the upper plate 34 is formed from a conductively-doped polycrystalline silicon layer. The two layers are separated by a dielectric layer 35. Lower plate 32 and upper plate 34 are both stacked on top of FET 12 and word line 36, resulting in a high-profile cell which requires more stringent process control for the connection of bit line 37 to access-node junction 38.

Alternately, other schemes involve the use of ferroelectric materials for DRAM cell capacitor dielectrics. Since ferroelectric materials have a dielectric constant more than 100 times that of silicon oxides, the use of such materials has the potential for allowing the size of DRAM cell capacitor to be shrunk to one of the smaller cell elements without resorting to three-dimensional structures. Critics of ferroelectric materials point out that such materials suffer from a "wearout" mechanism. In addition, they warn that there are many chemical incompatibilities with the other materials used in integrated circuit fabrication and that the layering of ferroelectric films within integrated circuit structures has not yet been done successfully.

The present invention utilizes a textured semiconductor as a storage node capacitor plate. Microstructures are formed by anodizing the semiconductor in hydrofluoric acid to produce the textured semiconductor. An article entitled "Microstructure and Formation Mechanism of Porous Silicon" by M. I. J. Beale, N. G. Chew, M. J. Uren, A. G. Culis, and J. D. Benjamin presents a systematic study of the formation and properties of microstructures produced in a semiconductor subjected to anodization in hydrofluoric acid. Elongated depressions are formed in the semiconductor where an anodizing current flows. Inhomogeneities at the semiconductor-electrolyte interface result in localization of the current flow and the initiation of depressions. Since the semiconductor between the inhomogeneities is highly resistive in comparison to the electrolyte concentrated at the inhomogeneities, the current flow is concentrated down the electrolyte at the inhomogeneities consuming the silicon and forming elongated depressions and resulting in a microstructure comprising elongated depressions.

SUMMARY OF THE INVENTION

The present invention is applicable to DRAM cell designs, such as the stacked capacitor design heretofore described or a poly-lined trench design, that utilize a conductively-doped polycrystalline layer for the storage node, or lower, capacitor plate. Anodization of the storage node plate in hydrofluoric acid is employed to create microstructures on the upper surface of the storage node plate. The microstructures are typified as elongated depressions. The microstructures increase the capacitance of the stacked capacitor without increasing cell size by providing a larger storage node plate area in the same cell area. The porous film density after anodization is one measure of the effectiveness of the anodization in creating the microstructures. The porous film density is equal to the percent of weight loss (for a given volume of material anodized) experienced during anodizing.

In addition to the formation of microstructures, a texturization process may be employed to create three-dimensional asperities on the upper surface of the storage node plate prior to the anodizing. The texturization process provides more inhomogeneities for the localization of current and the initiation of depressions. A final texturization process may also be employed subsequent to the anodization to provide three-dimensional asperities on the sides of the microstructures formed during anodization. The final texturization further increases the surface area of the storage node plate without increasing cell size.

Both the texturization prior to and subsequent to the anodization are accomplished by subjecting the storage node plate layer to a wet oxidation step. Since oxidation at the crystal grain boundaries on the surface of the poly layer proceeds more rapidly than elsewhere, the surface develops three-dimensional asperities. When maximum texturization has been achieved, the overlying oxide is removed during a wet etch step.

With texturization complete, a thin conformal (typically less than 100 Angstroms) dielectric layer of silicon nitride is deposited on top of the texturized poly layer. The nitride deposition is followed by the deposition of a second poly layer, which functions as the capacitor field plate. Since the nitride layer is thin in comparison to the texturized microstructures of the storage node plate layer, capacitive area is substantially augmented. Cell capacitance can be increased by more than 1,000 percent using a storage node plate so texturized.

It should be noted that the texturization process was developed by Xicor, Inc. as a means to increase electron injection during write and erase operations in electrically-erasable programmable read-only memory (EEPROM) cells. During EEPROM construction, texturization is followed by thermal oxidation of the texturized surface. The three-dimensional asperities on the surface of the poly create regions of increased electric field strength, which both lowers breakdown voltage of the thermally-grown oxide and enhances current leakage by several orders of magnitude. The thermal oxide thus functions as a tunneling layer. Because conduction in silicon dioxide is electrode limited, generally considered to be in accordance with what is known as the Fowler-Nordheim mechanism, the use of thin layers of silicon dioxide as a DRAM cell dielectric between two roughened surfaces is precluded. However, because conduction in silicon nitride is bulk limited, most likely in accordance with what is known as the Frankel-Poole mechanism, silicon nitride is a much more suitable thin layer dielectric for use in DRAMs where capacitive layers are not smooth.

This texturizing process was also described in U.S. patent application Ser. No. 7/460,453, filed Jan. 3, 1990, entitled "DRAM Cell Having a Texturized Polysilicon Lower Capacitor Plate for Increased Capacitance," by inventors Pierre C. Fazan and Ruojia R. Lee.

BRIEF DESCRIPTION OF THE DRAWINGS

FIGS. 1 through 3 depict existing technologies, while FIGS. 4 through 11 depict the fabrication of a DRAM array having a capacitor design conforming to the present invention.

FIG. 1 is a cross-sectional view of a DRAM cell having a conventional planar capacitor.

FIG. 2 is a cross-sectional view of a DRAM cell having a typical trench capacitor.

FIG. 3 is a cross-sectional view of a DRAM cell having a typical stacked capacitor.

FIG. 4 is a cross-sectional view of a DRAM cell of the stacked capacitor design type during the fabrication process and subsequent to the deposition of the storage node poly layer.

FIG. 5 is a cross-sectional view of the DRAM cell of FIG. 4 following a wet oxidation of the storage node poly layer.

FIG. 6 is a cross-sectional view of the DRAM cell of FIG. 5 following a wet oxide etch which removes oxide that accumulated on the storage node poly layer during the wet oxidation step.

FIG. 7 is a cross-sectional view of the DRAM cell of FIG. 6 following anodizing of the storage node poly layer.

FIG. 9 is a cross-sectional view of the DRAM cell of FIG. 7 following the oxidation and etch depicted in FIGS. 8b and 8c.

FIG. 10 is a cross-sectional view of the DRAM cell of FIG. 9 following the blanket deposition of a dielectric layer, the blanket deposition of a polysilicon cell plate layer, and the masking of the cell plate layer.

FIG. 11 is an exaggerated enlarged cross-sectional view of a portion of the DRAM cell of FIG. 10 following the blanket deposition of a dielectric layer and the blanket deposition of a polysilicon cell plate layer.

DETAILED DESCRIPTION OF THE PREFERRED EMBODIMENT

Figure 1:
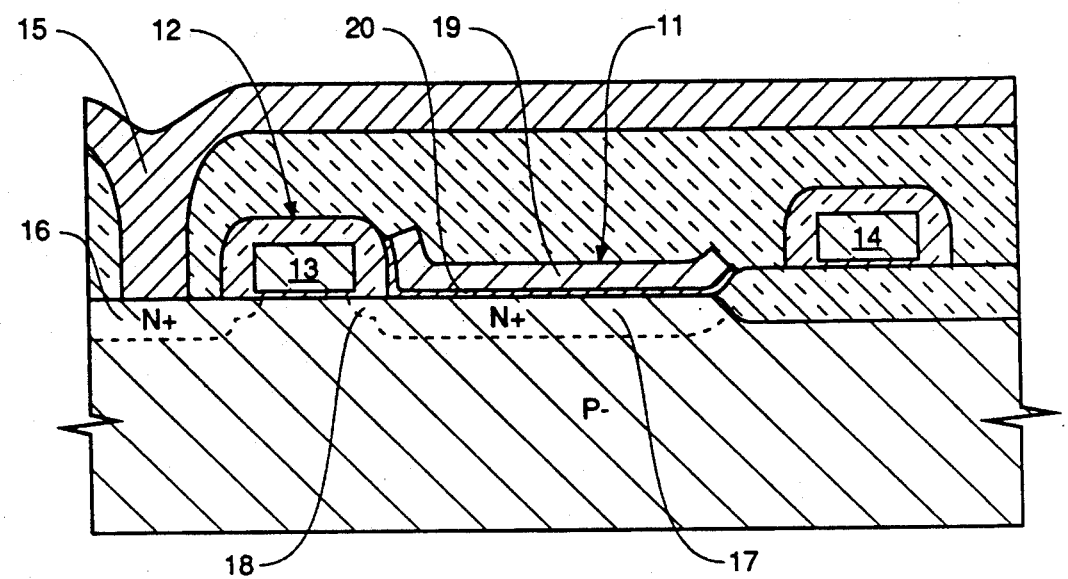
Figure 2:
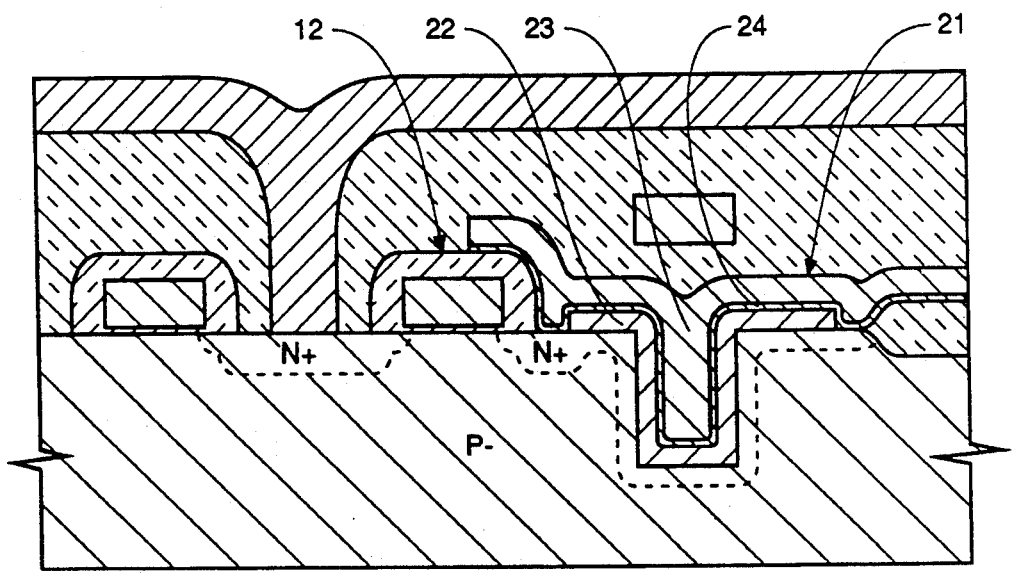
Figure 3:
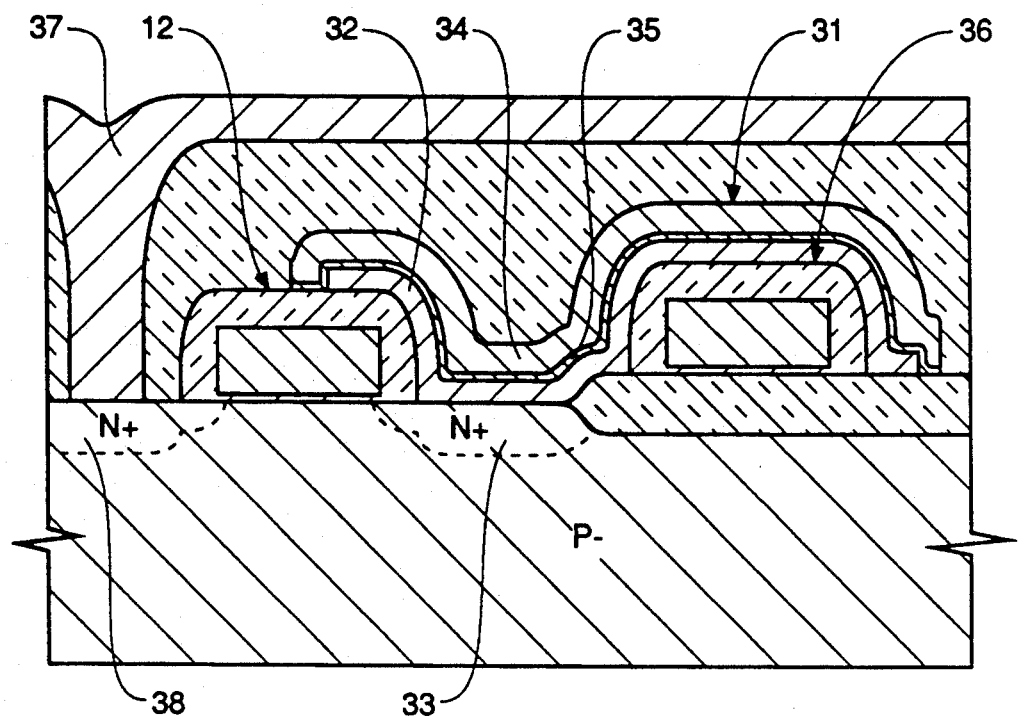
Figure 4:
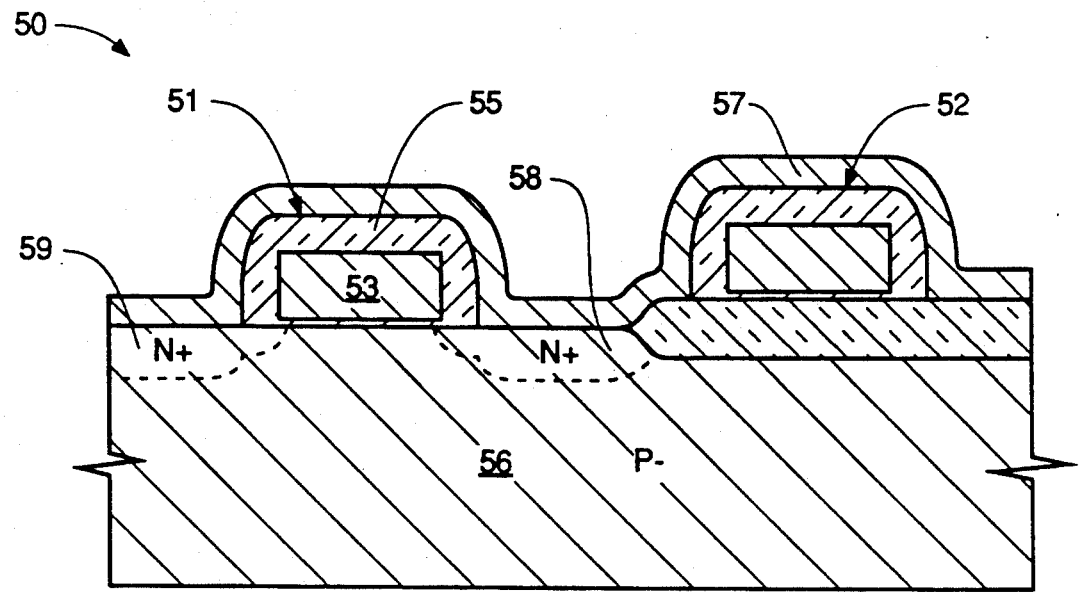

Referring now to FIG. 4, a DRAM cell 50 of stacked capacitor design is shown during the early stages of the fabrication process using a portion of a wafer of intrinsic polycrystalline silicon (poly). The cell's field-effect transistor (FET) 51 and word line 52 have already been formed. The FET gate 53, formed from a poly-1 layer, is covered on the top and sides by a silicon oxide spacer layer 55. A poly-2 layer 57, from which will be formed the cell's storage node capacitor plate, has been deposited over the FET 51, the word line 52, the storage node junction 58, and the access node junction 59. Poly-2 layer 57 is then doped with phosphorus to produce an extrinsic conductive poly-2 layer.

Figure 5:
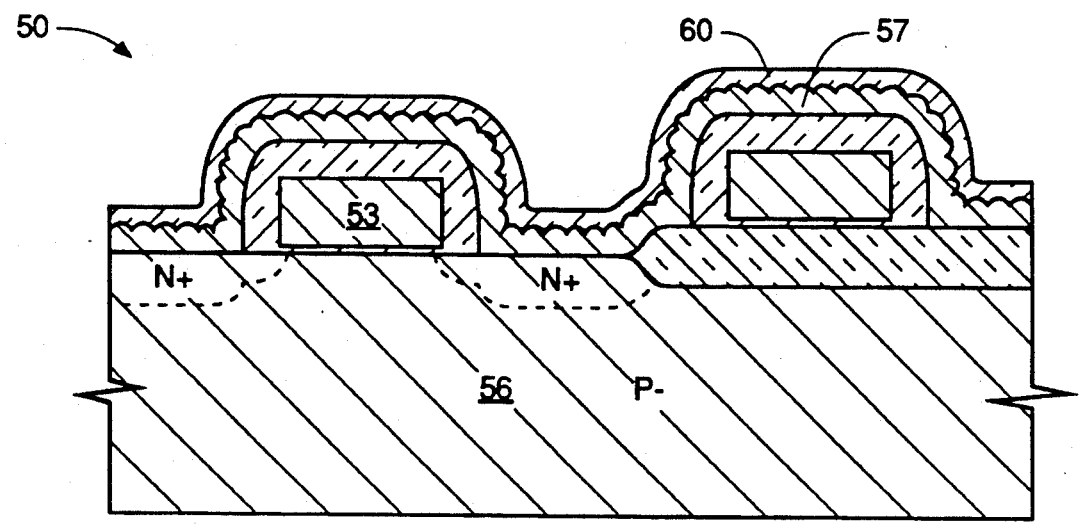

Referring now to FIG. 5, poly-2 layer 57 has been subjected to a wet oxidation step, which has created a multitude of three-dimensional asperities (inhomogeneities) on the surface of poly-2 layer 57. Conductive doping of poly-2 layer 57 was done prior to the wet oxidation step because the oxidation proceeds more rapidly at polysilicon crystal boundaries when the material is doped. In addition, the wet oxidation process has created an intermediate oxide layer 60 which covers the now texturized poly-2 layer 57.

Figure 6:
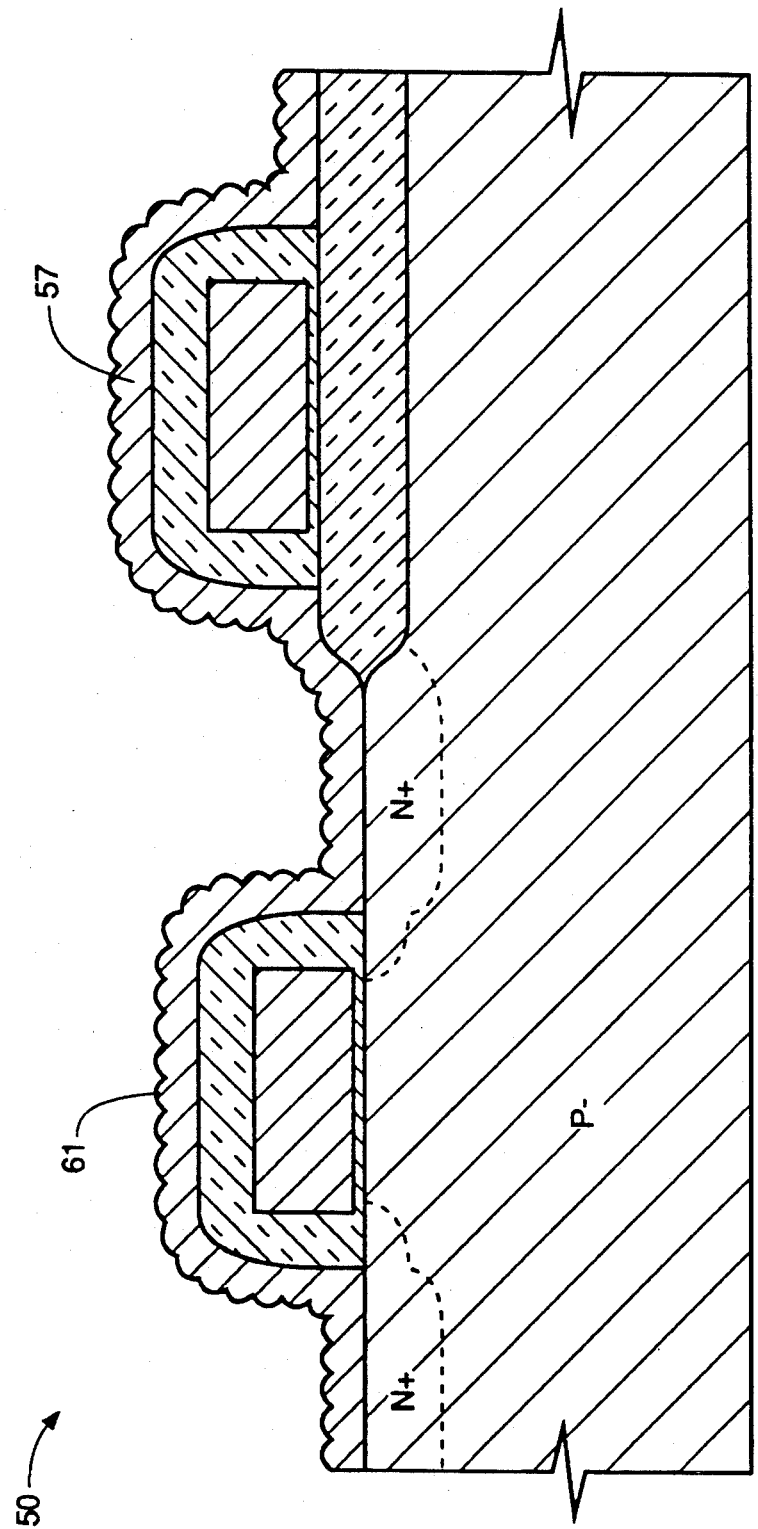

Referring now to FIG. 6, a wet oxide etch has removed intermediate oxide layer 60 which covered poly-2 layer 57, thus exposing the now texturized surface 61 of poly-2 layer 57.

Figure 7:
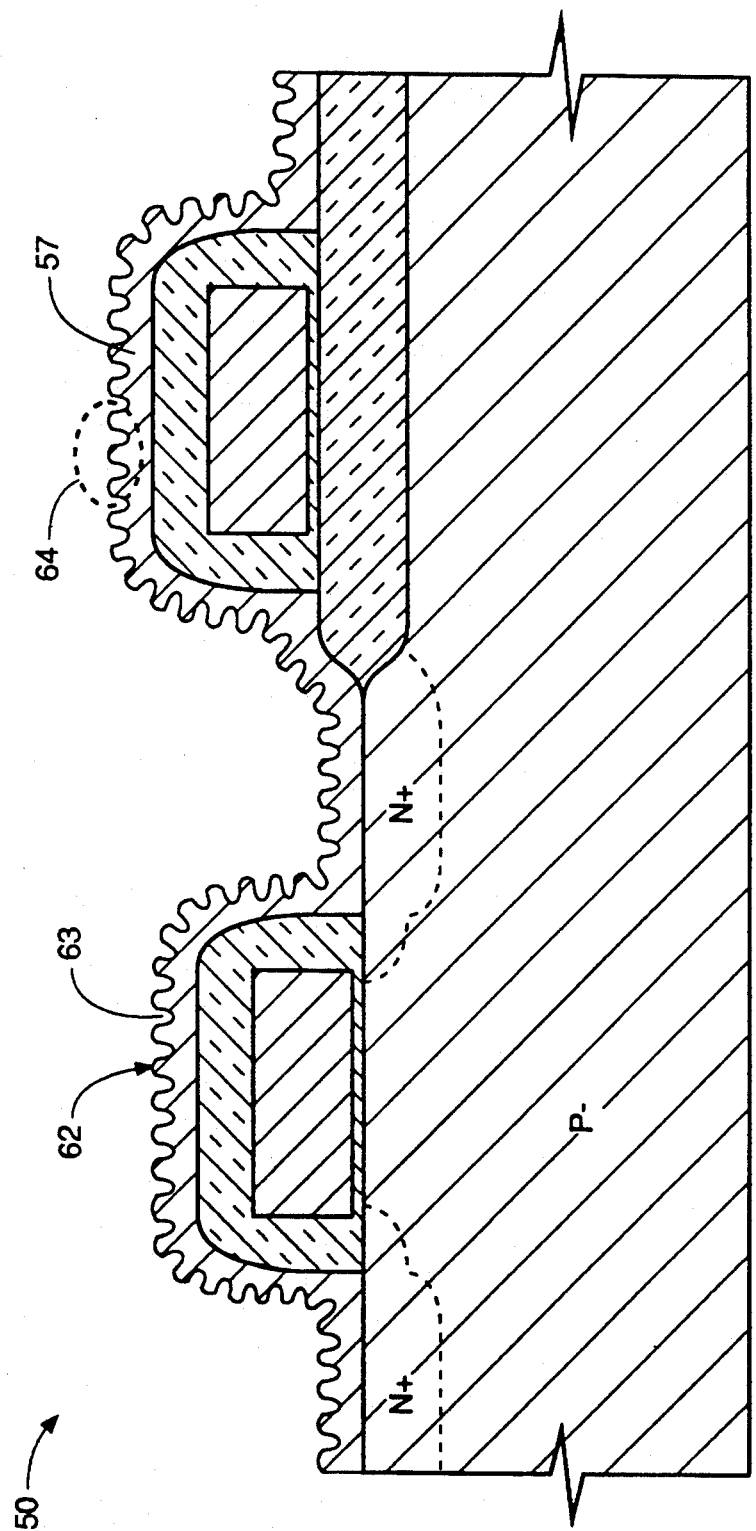

Referring now to FIG. 7, the poly-2 layer 57 has been anodized by submerging the wafer in a container of electrolytic solution of hydrofluoric acid and subjecting the wafer to an electrolytic current. The electrolytic current is generated between two electrodes, an anode and a cathode. The wafer, or poly-2 layer 57, comprises the anode. The container, or a platinum electrode immersed in the electrolytic solution parallel to the poly-2 layer 57, comprises the cathode.

Figure 8A:
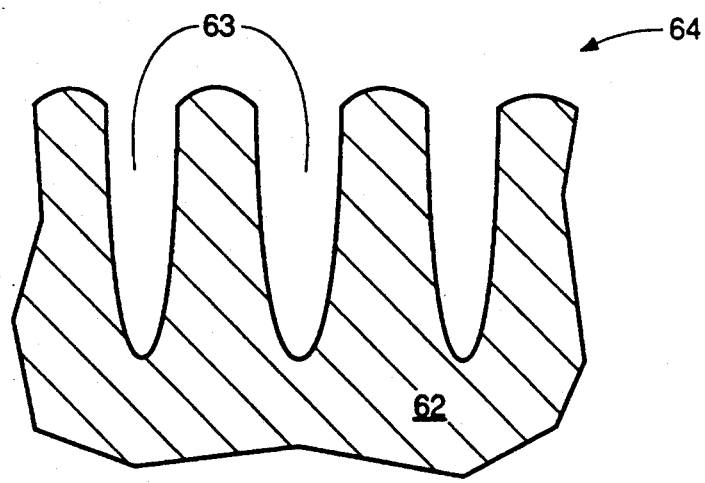
FIG. 8a is an exaggerated enlarged cross-sectional view of a portion of the microstructure formed during the anodizing step shown in FIG. 7.

Typically anodizing creates a textured surface on the material employed as the anode. In this case, silicon 62, having a microstructure 63 resembling elongated depressions, is formed by the anodic conversion of the poly-2 layer 57 silicon in the hydrofluoric acid. An enlarged exaggerated depiction of the textured substrate 62 formed by anodic conversion is shown in cross section in FIGS. 8a, 8b and 8c. FIG. 8a is an enlargement of portion 64 of FIG. 7 depicting the microstructure 63 of the textured layer 62. The anodic conversion of the poly-2 layer 57 increases the porous film density of the poly-2 layer 57. Since inhomogeneities at the start of anodization result in localization of the current flow to initiate depressions, the wet oxidation prior to anodization will further increase the porous film density by providing more inhomogeneities. The anodization of the poly-2 layer 57 typically has a charge within the range of 10 mA/cm$^2$ and 100 mA/cm$^2$ and is performed in a hydrofluoric acid solution having a concentration between 10 to 60 percent by weight. The anodization charge and concentration of hydrofluoric acid solution are typically chosen to produce a porous film density of substantially 45 percent.

Figure 8B:
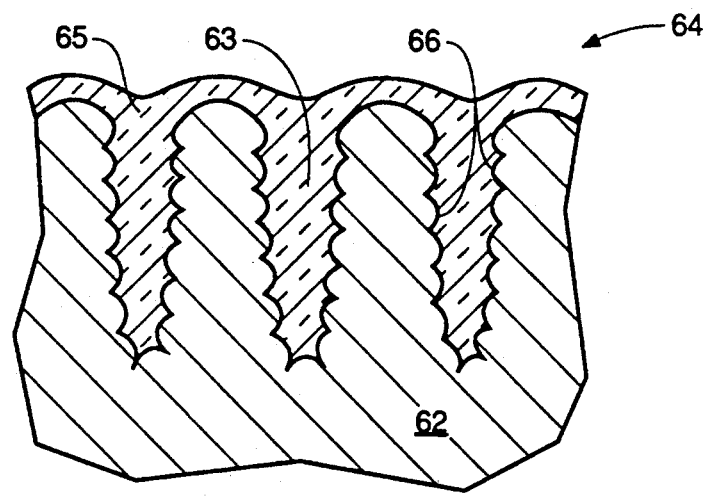
FIG. 8b is a cross-sectional view of FIG. 8a following a wet oxidation of the storage node poly layer.

Referring now to FIG. 8b, the textured silicon 62 has been subjected to a second wet oxidation step filling the depressions with an intermediate oxide layer 65 which covers the textured silicon 62. The oxidation step creates a texturized surface 66 comprising a multitude of three-dimensional asperities on the sides of the filled depressions 63.

Figure 8C:
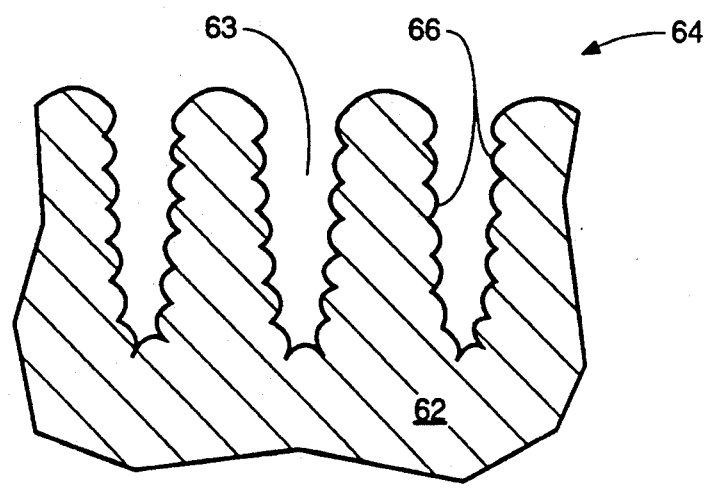
FIG. 8c is a cross-sectional view of FIG. 8b following a wet oxide etch which removes oxide that accumulated on the storage node poly layer during the wet oxidation step.

Referring now to FIG. 8c, a wet oxide etch has removed intermediate oxide layer 65 which covered the textured silicon 62, thus exposing the texturized surface 66 of the textured silicon 62. The texturized surface 66 is present on the textured silicon 62 shown in FIGS. 9 through 11. However, because of its minute size it is not discernable in the Figures.

Figure 9:
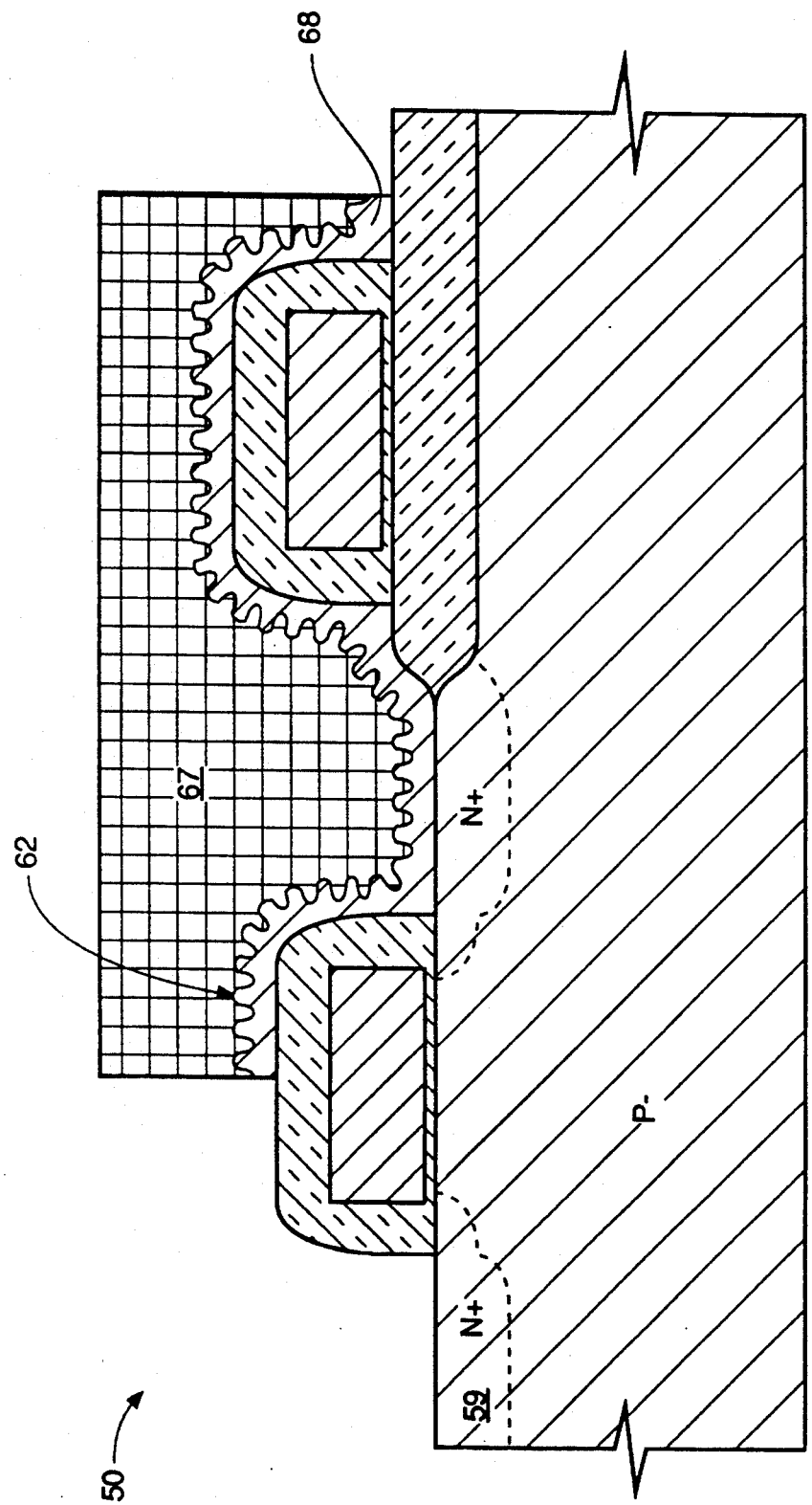

Referring now to FIG. 9, textured silicon 62 has been masked with first photomask 67 and etched (patterned) to form the cell's storage node capacitor plate 68. The etch also exposed the access node junction 59.

Figure 10:
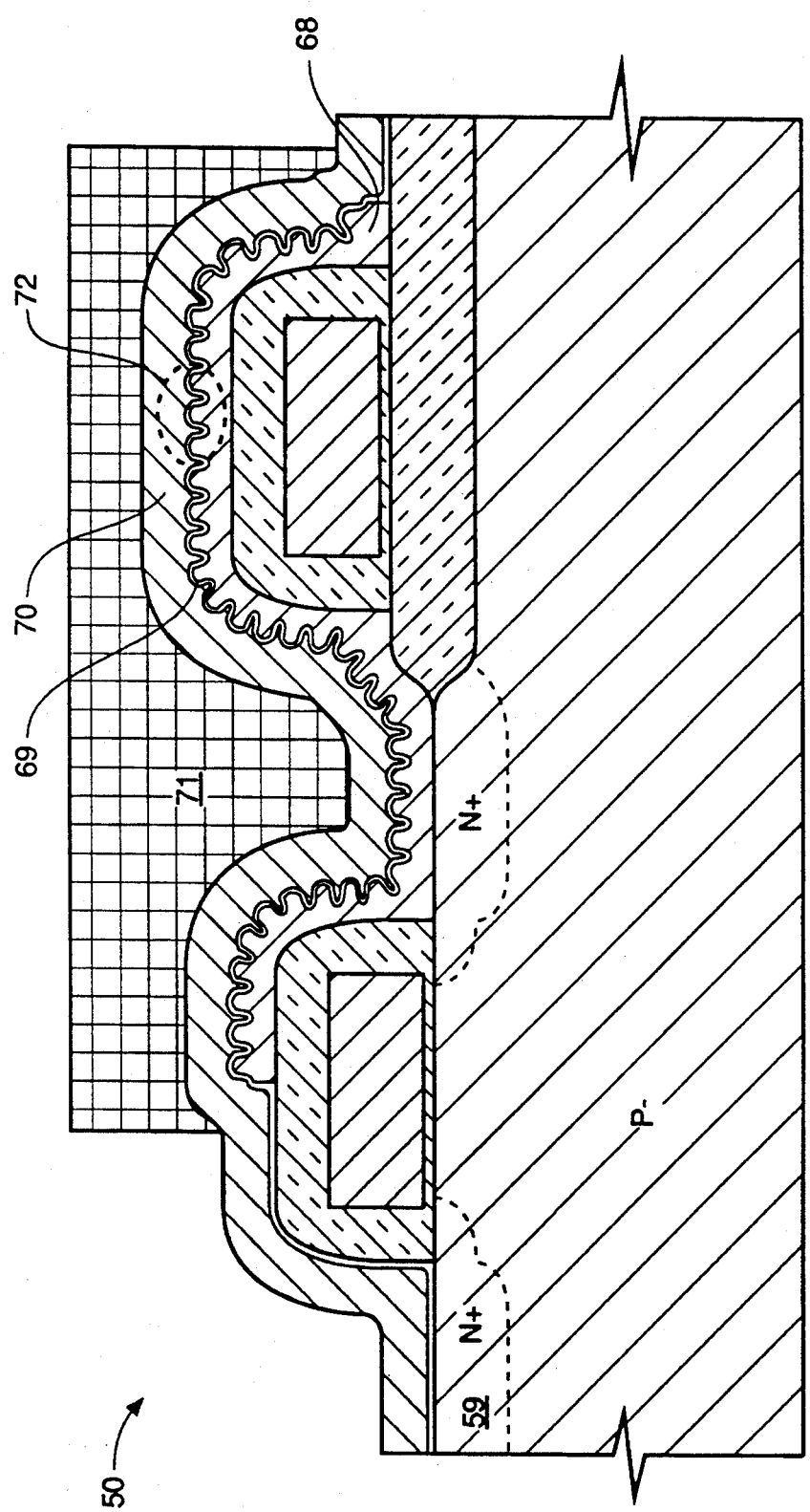

Referring now to FIG. 10, photomask 67 has been removed and the conformal blanket deposition of a dielectric layer of silicon nitride 69 has taken place. The dielectric layer has a thickness of less than 100 Angstroms. It is necessary for the dielectric layer to provide good step coverage and its deposition is followed by the blanket deposition of a poly-3 layer 70, conductive doping of poly-3 layer 70 with phosphorus, and the masking of poly-3 layer with second photomask 71.

Figure 11:
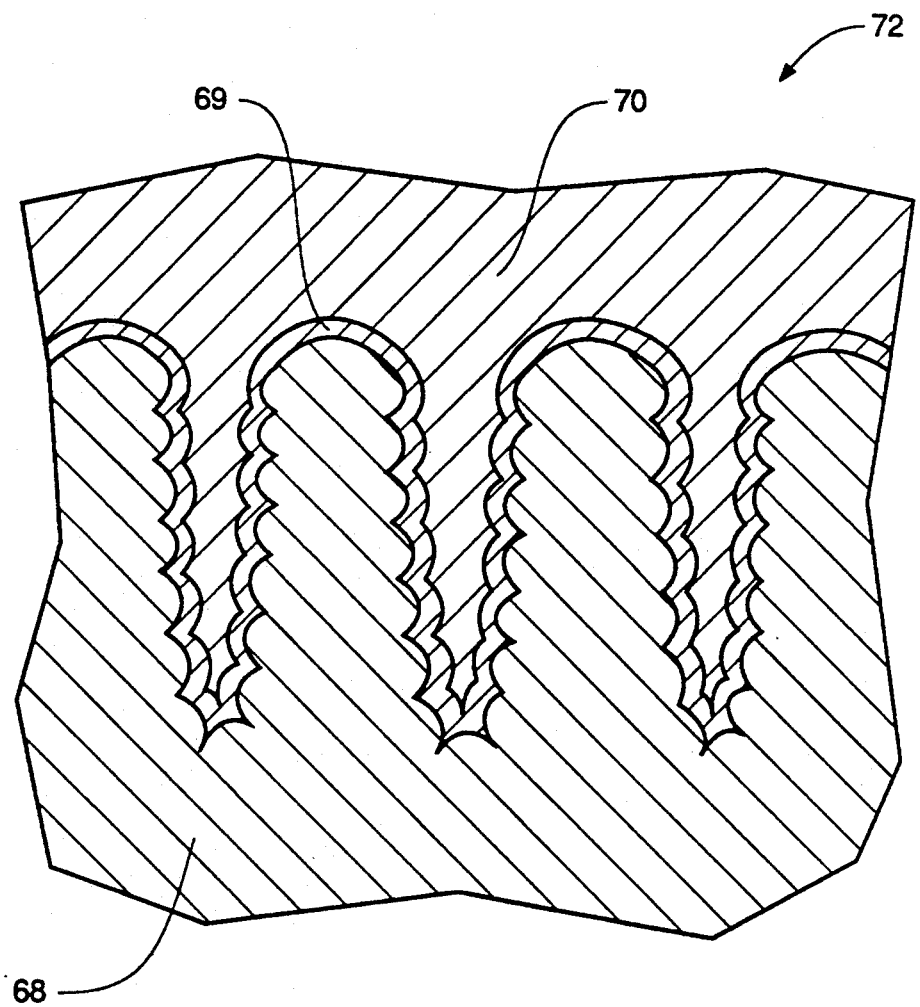

FIG. 11 is an exaggerated enlargement of portion 72 of FIG. 10 depicting the conformal deposition of silicon nitride 69 followed by the blanket deposition of the poly-3 layer 70.

Figure 12:
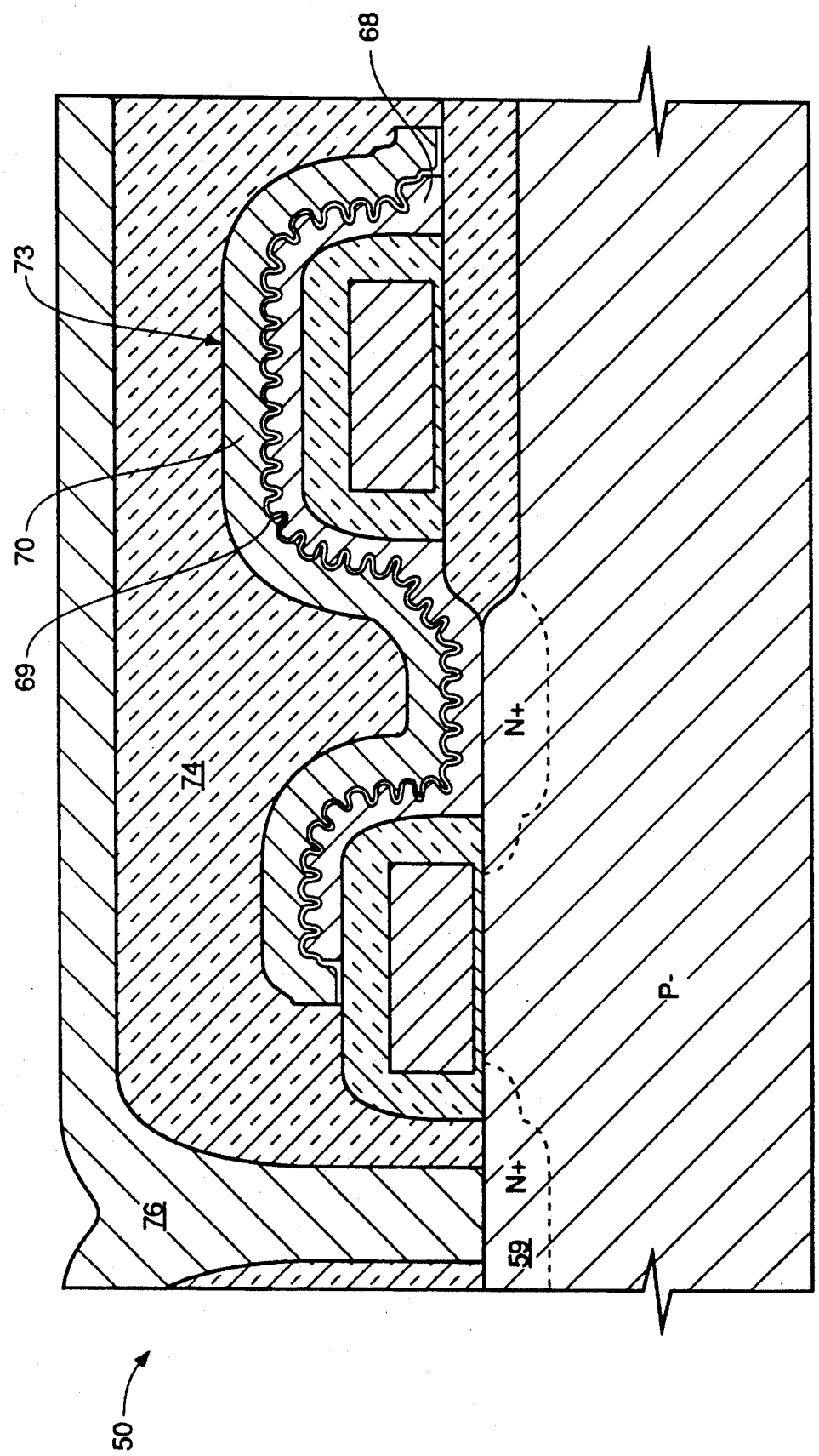
FIG. 12 is a cross-sectional view of the DRAM cell of FIG. 10 following the etching of the polysilicon cell plate layer.

Referring now to FIG. 12, poly-3 layer 70 and silicon nitride layer 69 have been etched, forming a cell plate 73, which functions as the cell capacitor's field plate, being dielectrically insulated from storage node capacitor plate 68 by silicon nitride layer 69. The process is completed with a conformal deposition of oxide 74 etched to expose access node junction 59. A bit line 76 is then deposited and patterned to contact the access node junction 59.

By anodizing the poly-2 layer 57 no additional masking steps are needed to increase the surface area of the cell's storage node capacitor plate while retaining the lateral dimension of the cell's storage node capacitor plate. By increasing the surface area, the capacitance of the cell's storage node capacitor is greatly increased.

In addition to negatively doping of the poly with phosphorous other pentavalent impurity atoms comprising arsenic, and antimony may be used. Alternately, the poly may be positively doped by using trivalent impurity atoms comprising aluminum, boron and gallium.

The invention may also be implemented wherein the stacked capacitor is fabricated overlaying the bit lines. Monocrystalline silicon may also be used in place of polycrystalline.

Although only a single embodiment of the invention has been described herein, it will be apparent to one skilled in the art that changes and modifications may be made thereto without departing from the spirit and the scope of the invention as claimed.

What is claimed is:

1. A storage capacitor, said capacitor having:
   a) an intrinsic silicon layer doped with an impurity to produce an extrinsic first doped silicon conductive layer having a textured upper surface, said first doped silicon layer forming a storage node capacitor plate, wherein said textured upper surface is fabricated by anodizing said first doped silicon layer, said anodizing consuming portions of said first doped silicon layer to produce microstructures resembling elongated depressions, a porosity of said textured upper surface measured by a porous film density, said porous film density equal to the percent of weight loss for a given volume of said first doped silicon layer experienced during said anodizing, said anodizing increasing a surface area of said storage node capacitor plate, and wherein said textured upper surface is further fabricated by texturizing the surface of said microstructures to further increase the surface area of said storage node capacitor plate, said texturizing producing three-dimensional asperities, said textured upper surface thereby defined by microstructures having three dimensional asperities;

b) a dielectric layer having lower and upper surfaces, the textured upper surface of said first doped silicon layer being in contact at substantially all points with the lower surface of said dielectric layer, said dielectric layer being substantially conformal with the textured upper surface of said first doped silicon layer; and c) a further intrinsic silicon layer doped with an impurity to produce an extrinsic second doped silicon conductive layer having lower and upper surfaces, said lower surface being in contact with the upper surface of said dielectric layer and being substantially conformal thereto.

2. The storage capacitor of claim 1, wherein said first and second doped silicon layers are positively doped layers.

3. The storage capacitor of claim 2, wherein said impurity is a trivalent atom comprising aluminum, boron and gallium, said trivalent atom effecting said positively doped layers.

4. The storage capacitor of claim 1, wherein said first and second doped silicon layers are negatively doped layers.

5. The storage capacitor of claim 4, wherein said impurity is a pentavalent atom comprising arsenic, antimony, and phosphorous, said pentavalent atom effecting said negatively doped layers.

6. The storage capacitor of claim 1, wherein said first and second doped silicon layers are oppositely doped, one of said doped layers being negatively doped and one of said doped layers being positively doped.

7. The storage capacitor of claim 6, wherein said impurity is a trivalent atom comprising aluminum, boron and gallium, said trivalent atom effecting said positively doped layers.

8. The storage capacitor of claim 6, wherein said impurity is a pentavalent atom comprising arsenic, antimony, and phosphorous, said pentavalent atom effecting said negatively doped layers.

9. The storage capacitor of claim 1, wherein said dielectric layer further comprises silicon nitride.

10. The storage capacitor of claim 9, wherein the thickness of said silicon nitride layer is less than 100 Angstroms.

11. The storage capacitor of claim 1, wherein said anodizing further comprises submerging said first doped silicon layer in a container of electrolytic solution comprising hydrofluoric acid and subjecting said first doped silicon layer and said electrolytic solution to an electrolytic current, said current generated between two electrodes, one being an anode and one being a cathode.

12. The storage capacitor of claim 11, wherein said anode further comprises said first doped silicon layer.

13. The storage capacitor of claim 11, wherein said first doped silicon layer is a portion of a semiconductor wafer, said anode comprising said wafer.

14. The storage capacitor of claim 11, wherein said container is defined by walls, said cathode comprising said walls.

15. The storage capacitor of claim 11, wherein said cathode further comprises a platinum electrode immersed in said electrolytic solution parallel to said first doped silicon layer.

16. The storage capacitor of claim 11, further comprising said electrolytic current being within a range of 10 $mA/cm^2$ and 100 $mA/cm^2$ and with said hydrofluoric acid solution having a concentration between 10 to 60 percent by weight.

17. The storage capacitor of claim 16, wherein said porous film density falls within the range of 20 to 70 percent, with a preferred porous film density of substantially 45 percent.

18. The storage capacitor of claim 1, further comprising increasing said porous film density by the formation of an initial texturized surface on said first doped silicon layer prior to said anodizing and prior to said forming said textured upper surface.

19. The storage capacitor of claim 18, wherein a formation of an oxide layer on said first doped silicon layer prior to said anodizing forms said initial texturized surface, said oxide layer producing inhomogeneities to increase current flow and initiate depressions in said first doped silicon layer during said anodizing, said oxide layer subsequently removed to expose said initial texturized surface prior to said anodizing.

20. The storage capacitor of claim 19, wherein said oxide layer is grown with a wet oxidation.

21. The storage capacitor of claim 19, wherein said oxide layer is removed with a wet oxide etch.

22. The storage capacitor of claim 1, wherein a formation of an oxide layer on said microstructures subsequent to said anodizing forms said three-dimensional asperities on said microstructures, said oxide layer subsequently removed to expose the textured upper surface thus formed.

23. The storage capacitor of claim 22, wherein said oxide layer is grown with a wet oxidation.

24. The storage capacitor of claim 22, wherein said oxide layer is removed with a wet oxide etch.

25. The storage capacitor of claim 1, wherein said first and second doped silicon layers comprise polycrystalline silicon.

26. The storage capacitor of claim 1, wherein said first and second doped silicon layers comprise monocrystalline silicon.

27. An enhanced-capacitance DRAM cell comprising:

a) a field-effect transistor (FET) constructed on a silicon substrate, a first portion of said substrate being conductively-doped to function as the FET's access node junction and a second portion of said substrate being conductively-doped to function as the FET's storage node junction;

b) a storage capacitor, said capacitor having:
1) an intrinsic silicon layer doped with an impurity to produce an extrinsic first doped silicon conductive layer having a textured upper surface, said first doped silicon layer forming a storage node capacitor plate in electrical communication with said storage node junction, wherein said textured upper surface is fabricated by anodizing said first doped silicon layer, said anodizing consuming portions of said first doped silicon layer to produce microstructures resembling elongated depressions, a porosity of said textured upper surface measured by a porous film density, said porous film density equal to the percent of weight loss for a given volume of said first doped silicon layer experienced during said anodizing, said anodizing increasing a surface area of said storage node capacitor plate, and wherein said textured upper surface is further fabricated by texturizing the surface of said microstructures to further increase the surface area of said storage node capacitor plate, said texturizing producing three-dimensional asperities, said textured upper surface thereby defined by microstructures having three-dimensional asperities;

2) a dielectric layer having lower and upper surfaces, the textured upper surface of said first doped silicon layer being in contact at substantially all points with the lower surface of said dielectric layer, said dielectric layer being substantially conformal with the textured upper surface of said first doped silicon layer; and c) a further intrinsic silicon layer doped with an impurity to produce an extrinsic second doped silicon conductive layer having lower and upper surfaces, said lower surface being in contact with the upper surface of said dielectric layer and being substantially conformal thereto.

28. The enhanced-capacitance DRAM cell of claim 27, further comprising said first and second doped silicon layers being positively doped, said first and second doped silicon layers being negatively doped, and said first and second doped silicon layers being oppositely doped, one of said doped layers being negatively doped and one of said doped layers being positively doped.

29. The enhanced-capacitance DRAM cell of claim 27, wherein said impurity is a trivalent atom comprising aluminum, boron and gallium.

30. The enhanced-capacitance DRAM cell of claim 28, wherein said impurity is a pentavalent atom comprising arsenic, antimony, and phosphorous.

31. The enhanced-capacitance DRAM cell of claim 27, wherein said dielectric layer further comprises silicon nitride.

32. The enhanced-capacitance DRAM cell of claim 31, wherein the thickness of said silicon nitride layer is less than 100 Angstroms.

33. The enhanced-capacitance DRAM cell of claim 27, wherein said anodizing further comprises submerging said first doped silicon layer in a container of electrolytic solution comprising hydrofluoric acid and subjecting said first doped silicon layer and said electrolytic solution to an electrolytic current, said current generated between two electrodes, one being an anode and one being a cathode.

34. The enhanced-capacitance DRAM cell of claim 33, wherein said anode comprises said first doped silicon layer and said silicon substrate.

35. The enhanced-capacitance DRAM cell of claim 33, wherein said container is defined by walls, said cathode comprising said walls and a platinum electrode immersed in said electrolytic solution parallel to said first doped silicon layer.

36. The enhanced-capacitance DRAM cell of claim 33, further comprising said electrolyte current being within a range of 10 mA/cm$^2$ and 100 mA/cm$^2$ and said hydrofluoric acid solution having a concentration between 10 to 60 percent by weight.

37. The enhanced-capacitance DRAM cell of claim 36, wherein said porous film density falls within the range of 20 to 70 percent, with a preferred porous film density of substantially 45 percent.

38. The enhanced-capacitance DRAM cell of claim 27, further comprising increasing said porous film density by the formation of an initial texturized surface on said first doped silicon layer prior to said anodizing and prior to said forming said textured upper surface.

39. The enhanced-capacitance DRAM cell of claim 38, wherein a formation of an oxide layer on said first doped silicon layer prior to said anodizing forms said initial texturized surface, said oxide layer producing inhomogeneities to increase current flow and initiate depressions in said first doped silicon layer during said anodizing, said oxide layer subsequently removed to expose said initial texturized surface prior to said anodizing.

40. The enhanced-capacitance DRAM cell of claim 27, wherein said first and second doped silicon layers comprise polycrystalline silicon and monocrystalline silicon.

41. The storage capacitor of claim 27, wherein a formation of an oxide layer on said microstructures subsequent to said anodizing forms said three-dimensional asperities on said microstructures, said oxide layer subsequently removed to expose the textured upper surface thus formed.

* * * * *